(12) United States Patent
Takeuchi

(10) Patent No.: US 6,335,560 B1
(45) Date of Patent: Jan. 1, 2002

(54) SEMICONDUCTOR DEVICE HAVING A MARK SECTION AND A DUMMY PATTERN

(75) Inventor: Masahiko Takeuchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/457,525

(22) Filed: Dec. 9, 1999

(30) Foreign Application Priority Data

May 31, 1999 (JP) .......................................... 11-152849

(51) Int. Cl.[7] ........................ H01L 23/544; H01L 29/06
(52) U.S. Cl. ...................... 257/620; 257/618; 257/619; 257/734; 257/752; 438/68; 438/113; 438/462; 438/460; 438/926
(58) Field of Search ................................ 257/734, 620, 257/619, 752, 618; 438/113, 458, 462, 426, 68, 466, 926

(56) References Cited

U.S. PATENT DOCUMENTS 5,028,981 A  *  7/1991  Eguchi ......................... 357/68

FOREIGN PATENT DOCUMENTS

| JP | 59-186342 | * | 10/1984 |
| JP | 60-15944 | * | 1/1985 |
| JP | 1-119088 A | * | 5/1989 |
| JP | 1-260818 A | * | 10/1989 |
| JP | 10-22376 | * | 1/1998 |
| JP | 10-189497 | * | 7/1998 |
| JP | 10-512098 | * | 11/1998 |
| JP | 10-335333 | * | 12/1998 |
| JP | 11-16999 | * | 1/1999 |
| JP | 10-335333 A | * | 12/1999 |
| WO | 96/15552 | * | 5/1996 |

* cited by examiner

*Primary Examiner*—Sara Crane
*Assistant Examiner*—Donghee Kang
(74) *Attorney, Agent, or Firm*—McDermott, Will & Emery

(57) ABSTRACT

A semiconductor device includes a plurality of real chip regions and dicing lines to separate the real chip regions on a semiconductor substrate. A dicing line includes a mark section and a mark forbidden region around the mark section. A dummy wiring pattern is formed to fill the dicing line or a portion of the real chip region to surround the mark section and the mark forbidden region. A dummy wiring pattern may be a single continuous wiring pattern or the single wiring pattern may be divided into segments. Alternatively, a dummy wiring pattern may be composed of a plurality of square portions arranged in a matrix fashion.

11 Claims, 16 Drawing Sheets

SEMICONDUCTOR DEVICE HAVING A MARK SECTION AND A DUMMY PATTERN

BACKGROUND OF THE INVENTION

1. Field of the Invention

The present invention relates to a semiconductor device having a mark section and a dummy pattern around the mark section, and more particularly, relates to a dummy pattern for chemical-mechanical polishing (CMP) purpose formed on a dicing line or on an actual chip region in a semiconductor device.

2. Background Art

Recently, in association with miniaturization of the structure of a semiconductor device, a process employing a chemical-mechanical polishing (CMP) technique has been sought. For instance, CMP is inevitably employed in a case where a shallow trench isolation (STI) structure is to be brought into element isolation in a field oxidation process, or in the case of a planarization process for smoothing an interlayer film introduced for improving a margin for photolithography.

There will be described a method of manufacturing a conventional semiconductor device including an abrasion process using the conventional CMP technique; primarily, manufacturing processes relevant to a dicing line.

FIGS. 19 through 21 are schematic representations for describing a dicing line used in a process for manufacturing a conventional semiconductor device. FIG. 19 is a schematic enlarged plan view showing a dicing line formed on the surface of a semiconductor substrate. FIGS. 20 and 21 are schematic cross-sectional views taken along line XX—XX and XXI—XXI shown in FIG. 19.

In FIG. 19, a dicing line 100 runs vertically along the center of the drawing, and guardrings 200 are provided on opposite sides of the dicing line 100. A real chip region (an actual chip region) 300 exists outside the respective guardrings 200.

In FIGS. 19 through 21, reference numeral 1 designates a trench isolation region; 2 designates an active region; 3 designates a first contact hole; 4 designates a third wiring pattern; 5 designates a second contact hole; 6 designates a fourth wiring pattern; 7 designates a first wiring pattern; and 8 designates a mark forbidden region where marks are forbidden.

FIGS. 22 through 28 are descriptive views for describing steps of forming a shallow trench isolation (STI) structure in the process for manufacturing a conventional semiconductor device. These drawings show a case where residues arise in the STI structure forming step, in connection with the schematic cross-sectional view of the conventional dicing line 100 taken along line XXI—XXI shown in FIG. 21.

As shown in FIG. 22, an underlying oxide film 10, a polysilicon film 11, and a nitride film 12 are formed, in this sequence in an active region 2 of the semiconductor substrate.

As shown in FIG. 23, a photoresist film 13 is patterned on the nitride film 12.

As shown in FIGS. 24 and 25, the silicon nitride film 12, the polysilicon film 11, and the underlying oxide film 10 are patterned while the photoresist film 13 is taken as a mask. Further, the semiconductor substrate is etched so as to form a groove in the active region 2, thus forming a trench.

As shown in FIG. 26, for example, a silicon oxide film is formed as a trench isolation dielectric film on the semiconductor substrate in order to form a trench region 1 in the trench.

As shown in FIG. 27, the silicon oxide film is removed from the nitride film 12 by means of the CMP technique. In this case, etch residues, such as a residual oxide film 1a, is likely to remain on the nitride film 12.

As shown in FIG. 28, if such a semiconductor substrate is etched and patterned, the residual oxide film 1a acts as a mask, thereby forming an undesired pattern.

Here, the underlying oxide film 10 has a thickness of, for example, 100 angstroms; the polysilicon film 11 has a thickness of, for example, 500 angstroms; the nitride film 12 has a thickness of, for example, 1500 angstroms; and the photoresist film 13 has a thickness of, for example, 5000 angstroms.

FIGS. 29 through 31 are descriptive views for describing a CMP abrasion step employed in a process for manufacturing a conventional semiconductor device. These drawings show a process flow followed in the event that the corners of the pattern are abraded excessively (resultant recesses will hereinafter be referred to as "dishing") when an interlayer insulating film formed on the first wiring pattern is abraded by means of the CMP technique.

As shown in FIG. 29, the trench regions 1 are formed so as to oppose the active region 2 of the semiconductor substrate interposed therebetween, and the first wiring pattern 7 is formed on the active region 2 as a mark.

As shown in FIG. 30, a first interlayer insulating film 14 is formed on the active region 2 and the first wiring pattern 7.

As shown in FIG. 31, the first interlayer insulating film 14 is abraded by means of the CMP technique. At this time, angular portions (corners) of the first wiring pattern 7 are likely to be exposed as a result of removal of the first interlayer insulating film 14, resulting in formation of so-called "dishing".

FIG. 32 shows the photoresist film 13 formed on the semiconductor substrate shown in FIG. 31, where the photoresist film 13 does not have a uniform thickness but has an irregular thickness.

Of the foregoing manufacturing processes, the CMP abrasion process greatly depends on the density, size, and geometry of a pattern, hence the corners of the pattern in the vicinity of etch residues caused by abrasion suffers a problem of being excessively abraded (being prone to becoming "dishing"). Alternatively, a low-density region of the pattern is also prone to being excessively abraded.

Further, the entirety of the conventional dicing line 100 is usually formed on an active region, and patterns other than various marks or side monitors does not exist in the dicing line 100. Further, a silicon oxide film tends to remain on a silicon nitride (SiN) film in the CMP abrasion step during the process for forming the STI structure.

The present invention has been conceived to solve these problems, and the object of the present invention is to provide a semiconductor device having a dicing line or an actual chip structure, which mitigates the problems associated with the CMP abrasion step.

SUMMARY OF THE INVENTION

According to one aspect of the present invention, a semiconductor device comprises a plurality of real chip regions and at least a dicing line to separate the real chip regions respectively formed on the semiconductor substrate. A mark section is defined in the dicing line or in the real chip regions. A mark forbidden region is formed to surround the mark section with a predetermined width in the dicing line or in the real chip regions. A dummy wiring pattern is formed so as to fill the dicing line or a portion of the real chip region to integrally and continuously surround the mark section and the mark forbidden region.

According to another aspect of the present invention, in a semiconductor device, a first dummy wiring pattern is formed so as to fill the dicing line or a portion of the real chip region to integrally and continuously surround the mark section and the mark forbidden region. An interlayer insulating layer is formed on the first dummy wiring pattern. Further, a second dummy wiring pattern is formed on the interlayer insulating layer so as to fill the dicing line or a portion of the real chip region to integrally and continuously surround the mark section and the mark forbidden region.

Other and further objects, features and advantages of the invention will appear more fully from the following description.

DETAILED DESCRIPTION OF THE PREFERRED EMBODIMENTS

Figure 1:
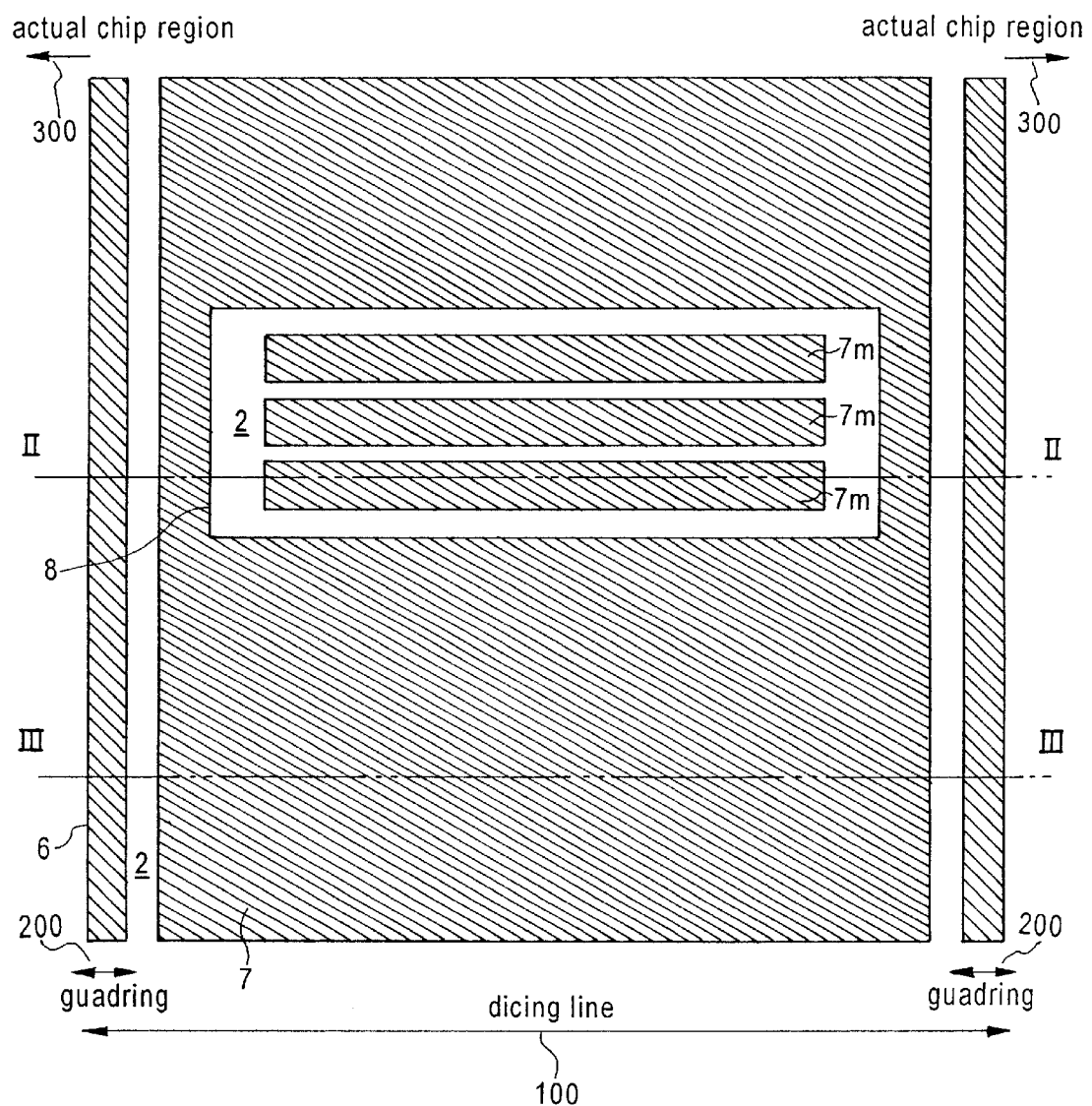
FIG. 1 is an enlarged schematic plan view showing a dicing line formed on a surface of a semiconductor substrate in a process for manufacturing a semiconductor device according to a first embodiment of the present invention.

By reference to the accompanying drawings, preferred embodiments of the present invention will now be described. In the drawings, like reference numerals are assigned to like or corresponding sections, and repetition of their descriptions is omitted or simplified.

First Embodiment

Figure 2:
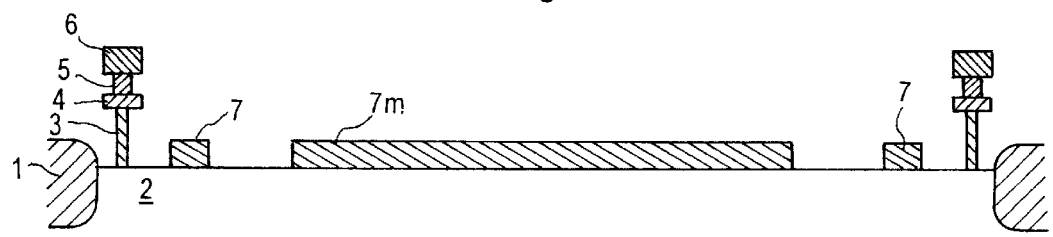
FIG. 2 is a schematic cross-sectional view taken along line I—I shown in FIG. 1.
Figure 3:
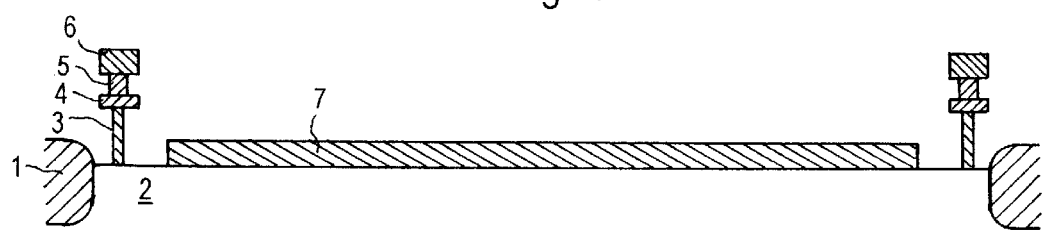
FIG. 3 is a schematic cross-sectional view taken along line II—II shown in FIG. 1.

FIGS. 1 through 3 are descriptive views for describing a dicing line used in a process for manufacturing a semiconductor device according to a first embodiment of the present invention. FIG. 1 is an enlarged schematic plan view showing a dicing line formed on the surface of a semiconductor substrate. FIG. 2 is a schematic cross-sectional view taken along line II—II shown in FIG. 1, and FIG. 3 is a schematic cross-sectional view taken along line III—III shown in FIG. 1.

In FIG. 1, a dicing line 100 runs vertically along the center of the drawing, and guardrings 200 are provided on opposite sides of the dicing line 100. A real chip region (an actual chip region) 300 exists outside the respective guardrings 200.

In FIGS. 1 through 3, reference numeral 1 designates a trench isolation region; 2 designates an active region; 3 designates a first contact hole; 4 designates a third wiring pattern; 5 designates a second contact hole; 6 designates a fourth wiring pattern; 7 and 7*m* designate a first wiring pattern; and 8 designates a mark forbidden region.

In the first embodiment, three horizontal strips of the first oxide film 7*m* formed in the longitudinal center of the drawing are taken as marks. An area of predetermined width surrounding the marks is taken as the mark forbidden region 8. The area of the dicing line 100 outside the mark forbidden region 8 is filled with a dummy pattern; that is, the first oxide film 7.

Figure 19:
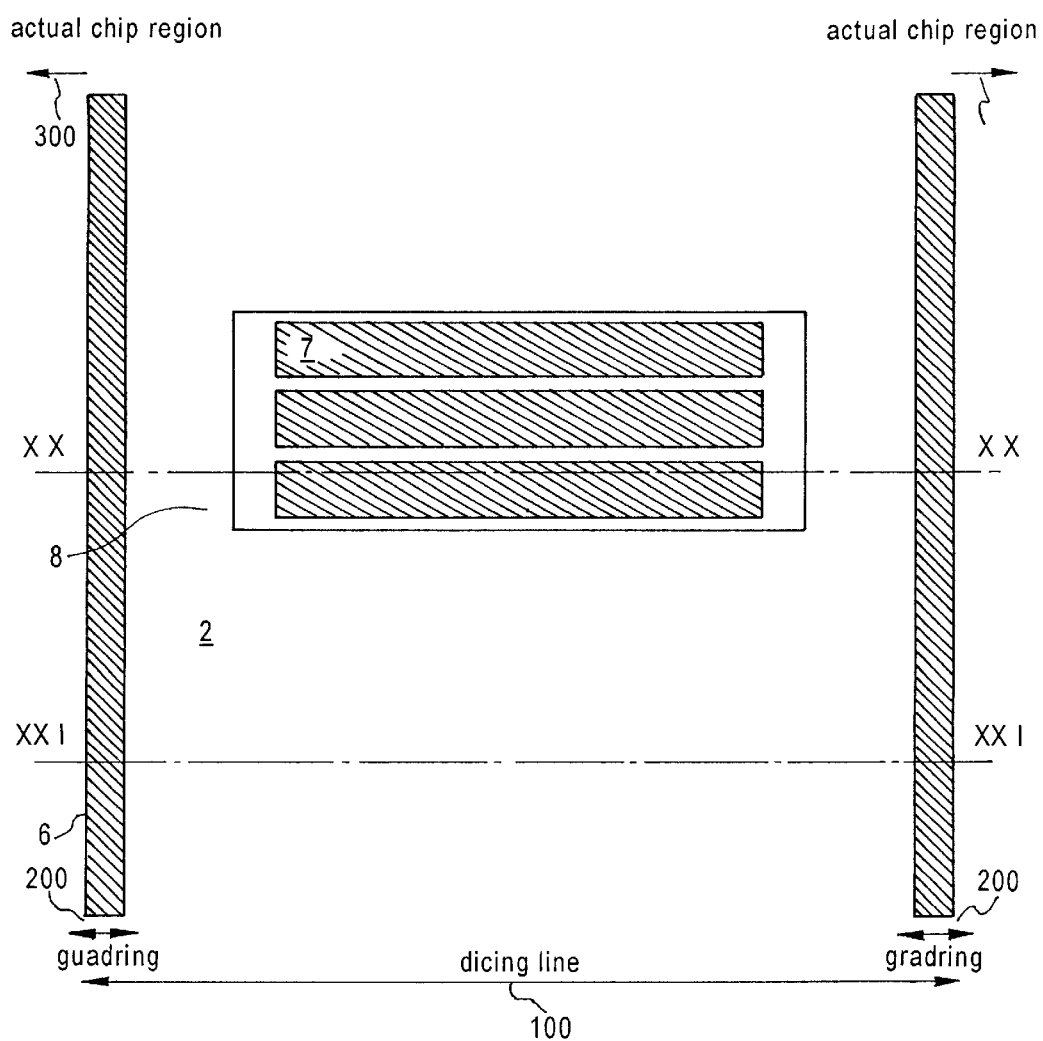
FIG. 19 is a schematic enlarged plan view showing a dicing line formed on the surface of a semiconductor substrate used in a process for manufacturing a conventional semiconductor device.
Figure 20:
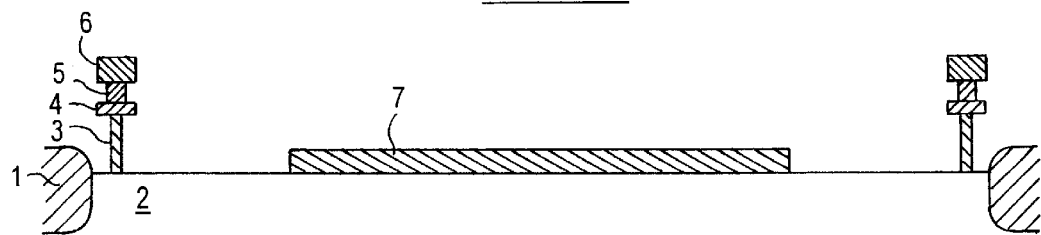
FIGS. 20 and 21 are schematic cross-sectional views taken along line XX—XX and XXI—XXI shown in FIG. 19.
Figure 21:
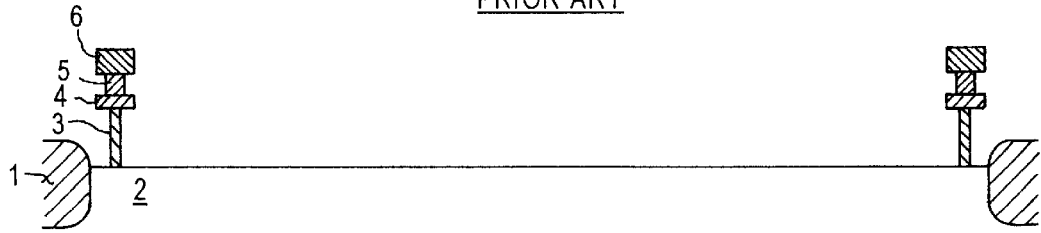
Figure 22:
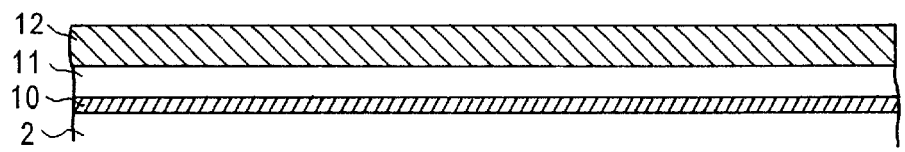
FIGS. 22 through 28 are descriptive views for describing steps of forming a shallow trench isolation structure in the process for manufacturing a conventional semiconductor device.
Figure 23:
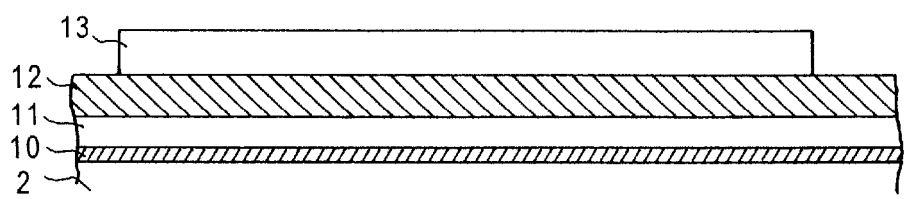
Figure 24:
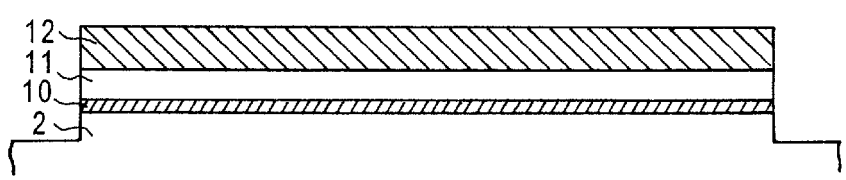
Figure 25:
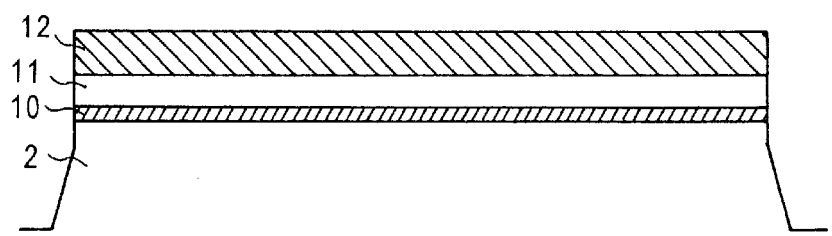
Figure 26:
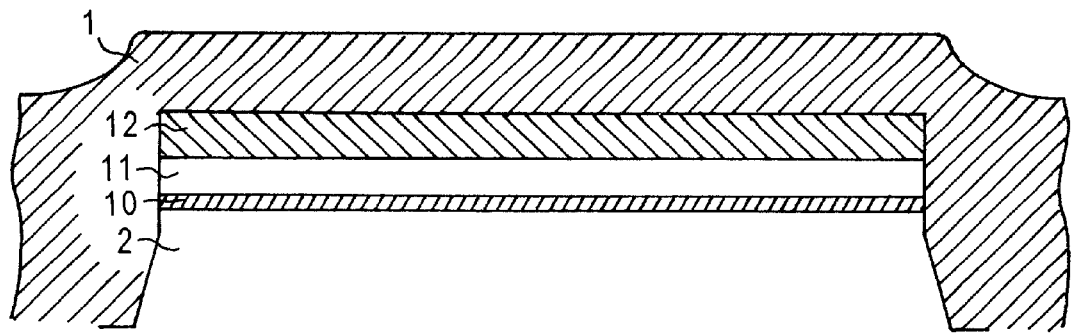
Figure 27:
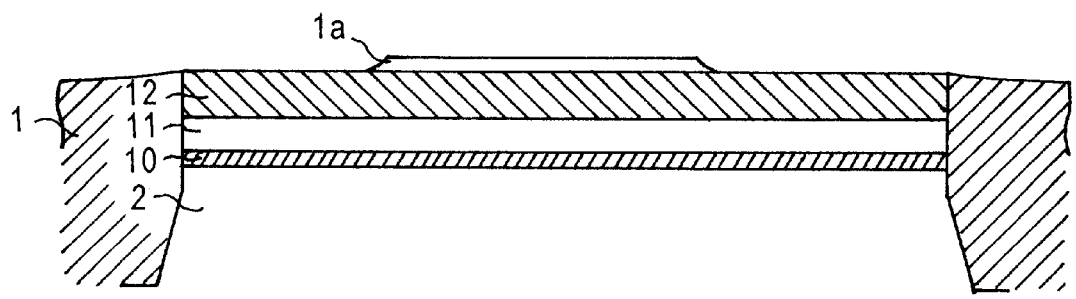
Figure 28:
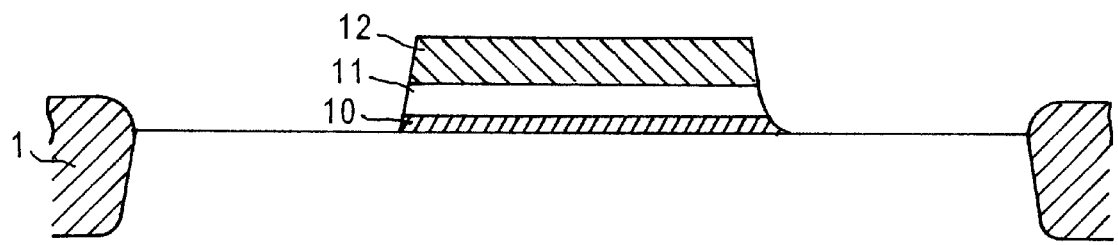
Figure 29:
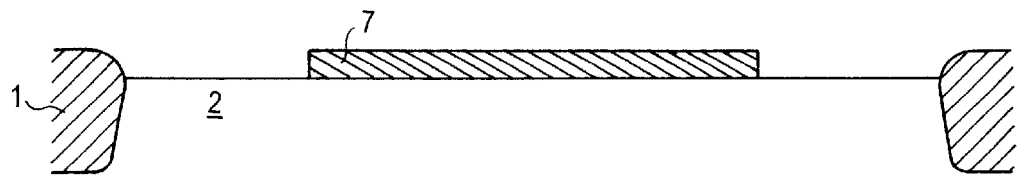
FIGS. 29 through 32 are descriptive views for describing a CMP abrasion steps employed in a process for manufacturing a conventional semiconductor device.
Figure 30:
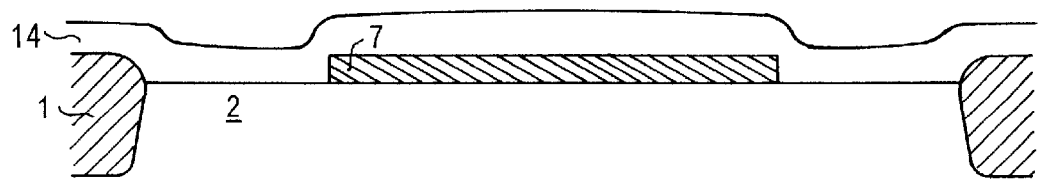
Figure 31:
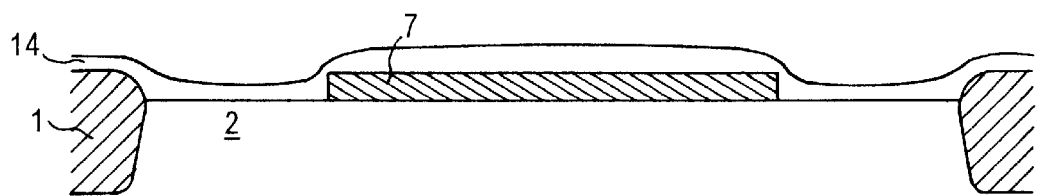
Figure 32:
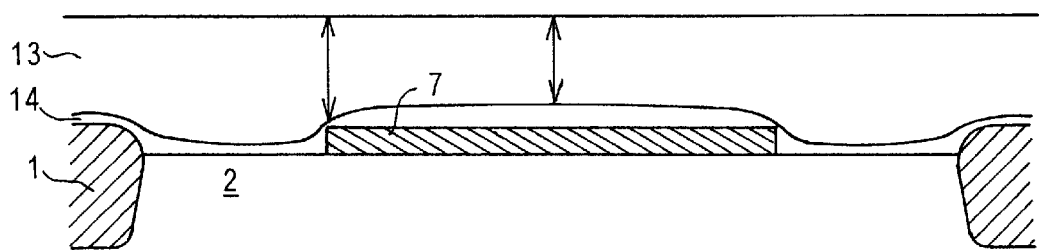

In contrast with the case of a conventional dicing line whose entirety is formed from an active region as shown in FIG. 19, a dummy pattern is formed in the dicing line 100 so as to surround the mark forbidden region 8, as described in the first embodiment. As a result, exposure of the corners of the mark and formation of "dishing", which would otherwise be caused when an interlayer insulating film formed on the dummy pattern is smoothed by means of the CMP technique, can be prevented.

Since a resist film is likely to be formed to a uniform thickness on the interlayer insulating film, a mark pattern can be stably formed.

Figure 4:
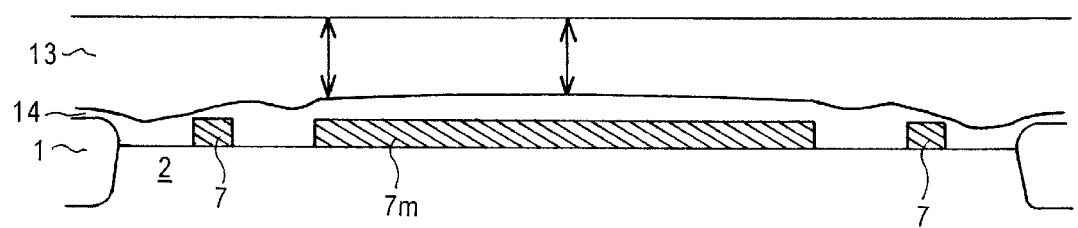
FIG. 4 is a schematic cross-sectional view showing an interlayer insulating film and a photoresit film on a semiconductor substrate in a first embodiment of the present invention.

FIG. 4 is a schematic cross-sectional view showing the semiconductor substrate in the foregoing state; specifically, when the photoresist film 13 is formed on the semiconductor substrate in the state shown in FIG. 2. The first oxide film 7m shown in the center of FIG. 4 is taken as a mark, and the first oxide films 7 of narrow width provided on the respective sides of the mark are dummy patterns. Even when the first interlayer insulating film 14 is abraded by means of the CMP technique, the corners of the mark are not exposed. Further, even if the photoresist film 13 has a small thickness, better uniformity is ensured in at least the vicinity of the mark.

Although the foregoing description has explained a case where the interlayer insulating film located on the dicing line 100 is abraded by means of the CMP technique, the present embodiment can also be applied to the real chip (actual chip) region, and the same advantageous result can be yielded.

In the first embodiment, the dicing line area or the actual chip region on the semiconductor substrate is filled with a dummy wiring pattern so as to integrally and continuously surround the mark.

Further, the dicing line area is filled with the dummy wiring pattern, exclusive of the guardrings and the forbidden region of the mark.

According to the first embodiment, the present invention prevents formation of etch residues during CMP abrasion and prevents abrasion of corners of the pattern during CMP abrasion (prevents formation of "dishing"), thus rendering the thickness of the resist film provided on the interlayer insulating film uniform and the formation of the pattern stable.

Second Embodiment

Figure 5:
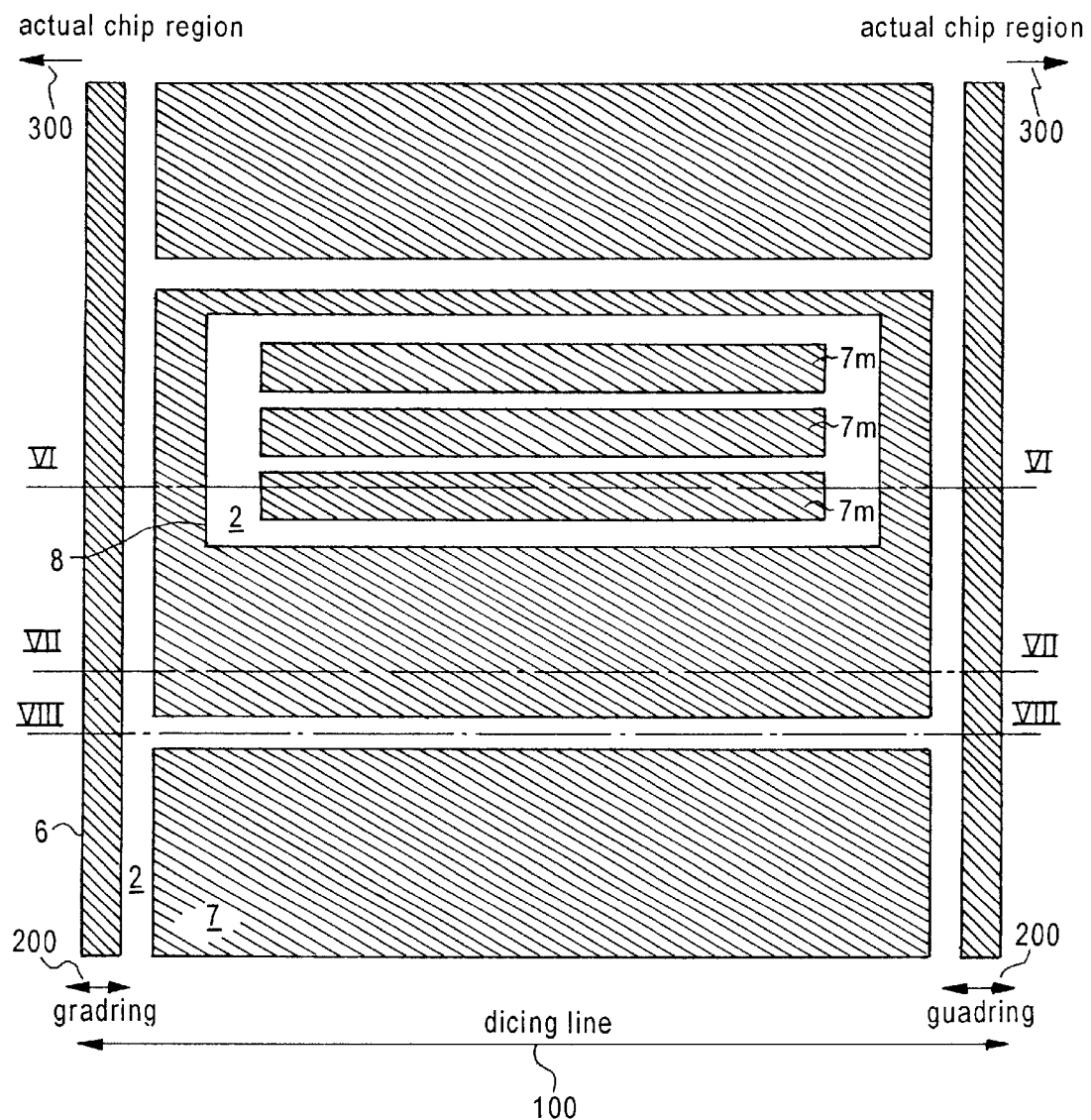
FIG. 5 is an enlarged schematic plan view showing a dicing line formed on the surface of a semiconductor substrate in the process of manufacturing a semiconductor device according to a second embodiment of the present invention.
Figure 6:
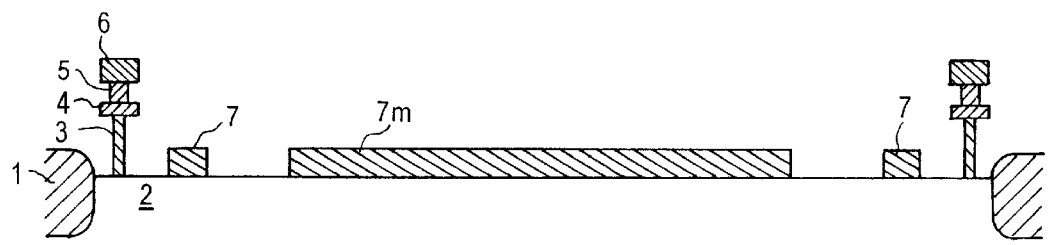
FIG. 6 is a schematic cross-sectional view taken along line VI—VI shown in FIG. 5.
Figure 7:
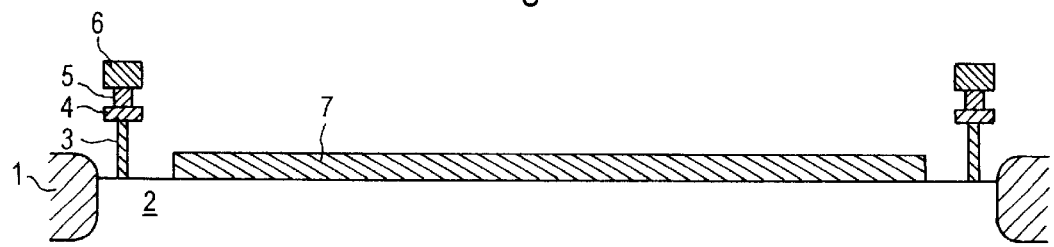
FIG. 7 is a schematic cross-sectional view taken along line VII—VII shown in FIG. 5.
Figure 8:
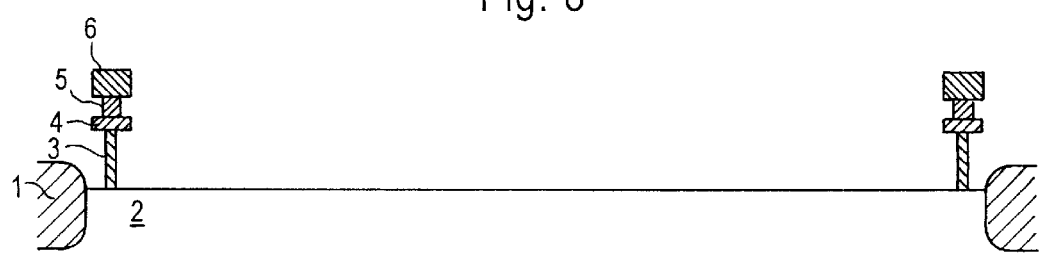
FIG. 8 is a schematic cross-sectional view taken along line VIII—VIII shown in FIG. 5.

FIGS. 5 through 8 are descriptive views for describing a dicing line used in the process of manufacturing a semiconductor device according to a second embodiment of the present invention. FIG. 5 is an enlarged schematic plan view showing a dicing line formed on the surface of a semiconductor substrate; FIG. 6 is a schematic cross-sectional view taken along line VI—VI' shown in FIG. 5; FIG. 7 is a schematic cross-sectional view taken along line VII—VII shown in FIG. 5; and FIG. 8 is a schematic cross-sectional view taken along line VIII—VIII shown in FIG. 5.

In FIG. 5, a dicing line 100 runs vertically along the center of the drawing, and guardrings 200 are provided on opposite sides of the dicing line 100, respectively. A real chip region (an actual chip region) 300 exists outside the respective guardrings 200. In FIGS. 5 through 8, reference numerals 1 through 8 are assigned to the same elements as those described in connection with the first embodiment, and hence their explanations will be omitted here.

In the second embodiment, three horizontal strips of the first oxide film 7m formed in the longitudinal center of the drawing are taken as marks. An area of predetermined width surrounding the marks is taken as the mark forbidden region 8. The area of the dicing line 100 outside the mark forbidden region 8 is filled with a dummy pattern; that is, the first oxide film 7. The first oxide film 7 filling the dicing line 100 is separated along line VIII—VIII shown in FIG. 5.

Figure 9:
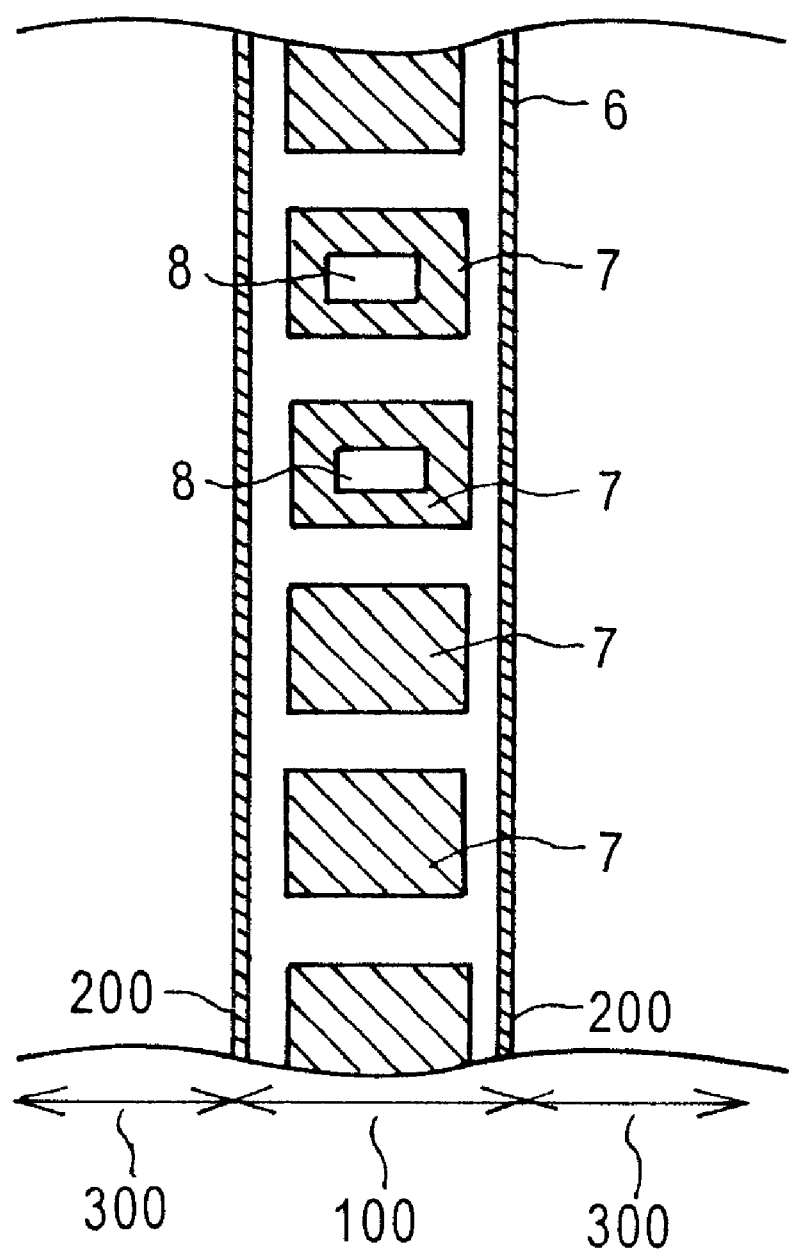
FIG. 9 is another schematic cross-sectional view of the surface of the semiconductor substrate in a second embodiment of the present invention.

FIG. 9 is another schematic cross-sectional view of the surface of the semiconductor substrate in above-described state. As shown in the drawing, the dummy pattern of the dicing line 100 vertically running through the drawing is divided into segments by means of horizontal separation lines running at right angles to the direction of the dicing line 100.

As mentioned above, the dummy pattern formed from the first oxide film 7 is formed so as to surround the mark forbidden regions 8 and is divided into segments of a constant length. As a result, there can be prevented exposure of the corners of the mark and formation of "dishing", which would otherwise be caused when an interlayer insulating film formed on the dummy pattern is smoothed by means of the CMP technique. Further, stress exerted on the first oxide film 7m of the dummy pattern can be mitigated.

Since a resist film is likely to be formed to a uniform thickness on the interlayer insulating film, a mark pattern can be reliably formed.

Since the stress exerted on the pattern is reduced, the semiconductor substrate becomes less susceptible to problems, such as exfoliation of a film during a subsequent heat treatment process.

According to the second embodiment, the present invention prevents formation of etch residue during CMP abrasion and prevents abrasion of corners of the pattern during CMP abrasion (prevents formation of "dishing"), thus rendering the thickness of the resist film provided on the interlayer insulating film uniform; and enables reliable formation of the pattern. Further, the present invention mitigates stress exerted on the dummy pattern; prevents exfoliation of a film; and prevents exfoliation of the side walls of the dummypattern (realizes so-called countermeasures against exfoliation of a frame)

Third Embodiment

Figure 10:
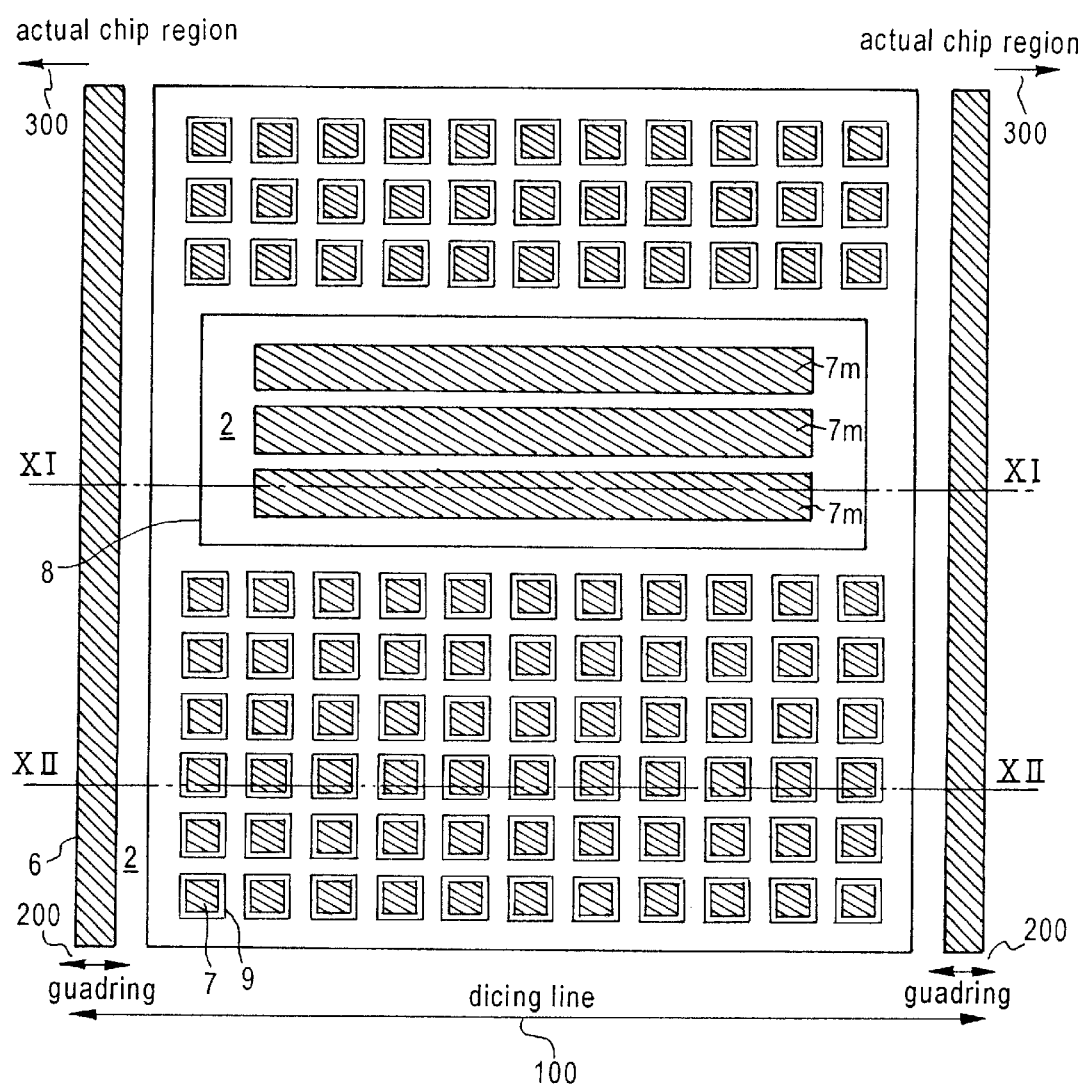
FIG. 10 is an enlarged schematic plan view showing a dicing line formed on the surface of a semiconductor substrate in a process of manufacturing a semiconductor device according to a third embodiment of the present invention.
Figure 11:
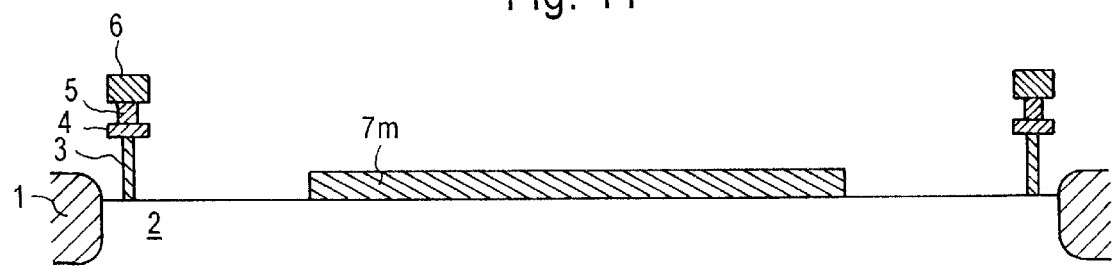
FIG. 11 is a schematic cross-sectional view taken along line XI—XI shown in FIG. 10.
Figure 12:
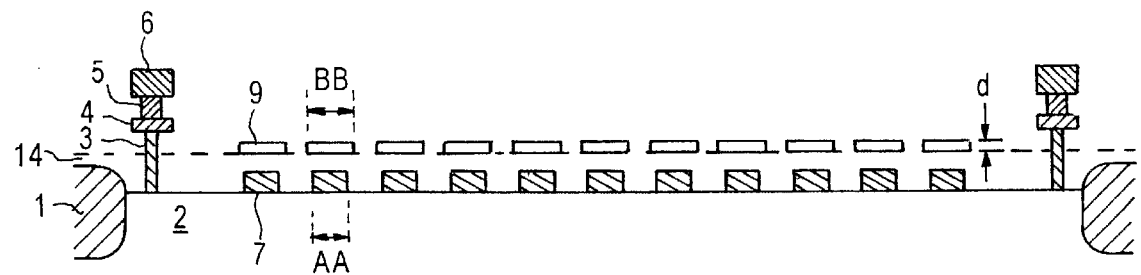
FIG. 12 is a schematic cross-sectional view taken along line XII—XII shown in FIG. 10.

FIGS. 10 through 12 are descriptive views for describing a dicing line used for a process of manufacturing a semiconductor device according to a third embodiment of the present invention. FIG. 10 is an enlarged schematic plan view showing a dicing line formed on the surface of a semiconductor substrate. FIG. 11 is a schematic cross-sectional view taken along line XI—XI shown in FIG. 10, and FIG. 12 is a schematic cross-sectional view taken along line XII—XII shown in FIG. 10.

In FIG. 10, a dicing line 100 runs vertically along the center of the drawing, and guardrings 200 are provided on opposite sides of the dicing line 100. A real chip region (an actual chip region) 300 exists outside the respective guardrings 200.

Further, in FIGS. 10 through 12, reference numerals 1 through 8 are assigned to the same elements as those described in connection with the first and second embodiments, and hence their explanations are omitted here. Reference numeral 9 designates a second wiring pattern; and 14 designates a first interlayer insulation film.

In the third embodiment, three horizontal strips of the first oxide film 7m formed in the longitudinal center of the drawing are taken as marks. An area of predetermined width surrounding the marks is taken as the mark forbidden region 8. The area of the dicing line 100 outside the mark forbidden region 8 is filled with a dummy pattern. More specifically, the dummy pattern comprises a plurality of first substantially-square wiring patterns 7 spaced apart from one another; and a plurality of second substantially-square wiring patterns 9 which are spaced apart from one another and are slightly larger than the first wiring patterns 7, wherein the second wiring patterns 9 are vertically aligned with and superimposed on the respective first wiring patterns 7 so as to fully cover the same by way of the first interlayer insulating film 14.

As in the third embodiment, a plurality of island-shaped dummy patterns are formed so as to surround the mark forbidden region B. As a result, exposure of the corners of the mark and formation of "dishing ", which would otherwise be caused when an interlayer insulating film formed on the dummy patterns is smoothed by means of the CMP technique, can be prevented.

Since a resist film is likely to be formed to a uniform thickness on the interlayer insulating film, a mark pattern can be stably formed.

In addition, the third embodiment yields the following advantageous results. In the event the interlayer insulating film 14 of the first wiring pattern 7 cannot be smoothed sufficiently, exfoliation of a film, which would be caused when side walls are formed by etching the second wiring patterns 9, would be a problem of concern. Such a problem can be prevented by fully covering the wiring patterns 7 with the second wiring patterns 9, thus enabling stable formation of a mark pattern.

At this time, taking the dimension of dummy patterns corresponding to the first wiring patterns 7 as AA, the dimension of dummy patterns corresponding to the second wiring patterns as BB, the dimensional accuracy of the first wiring patterns 7 as "aa," the dimensional accuracy of the second wiring patterns 9 as "bb," the accuracy of alignment between the first wiring pattern 7 and the second wiring pattern 9 as "cc," and the thickness of the second wiring pattern 9 as "dd", the following expression is given.

(BB-AA)/2=aa/2+bb/2+cc+dd.

As mentioned above, in the third embodiment, a plurality of separated lower dummy wiring patterns and a plurality of upper dummy wiring patterns, individuals of which are vertically aligned with each other, are formed around the mark section on the dicing line or the actual chip region on the semiconductor substrate, such that the lower dummy wiring patterns are covered with the upper dummy wiring patterns by way of an intermediate insulating film. Both the upper and lower dummy patterns are formed into substantially-square patterns and are arranged in a matrix pattern.

According to the third embodiment, the present invention prevents formation of etch residues during CMP abrasion, prevents abrasion of corners of the pattern during CMP abrasion (prevents formation of "dishing"), and prevents exfoliation of the side walls of the dummy pattern (realizes so-called countermeasures against exfoliation of a frame).

Fourth Embodiment

Figure 13:
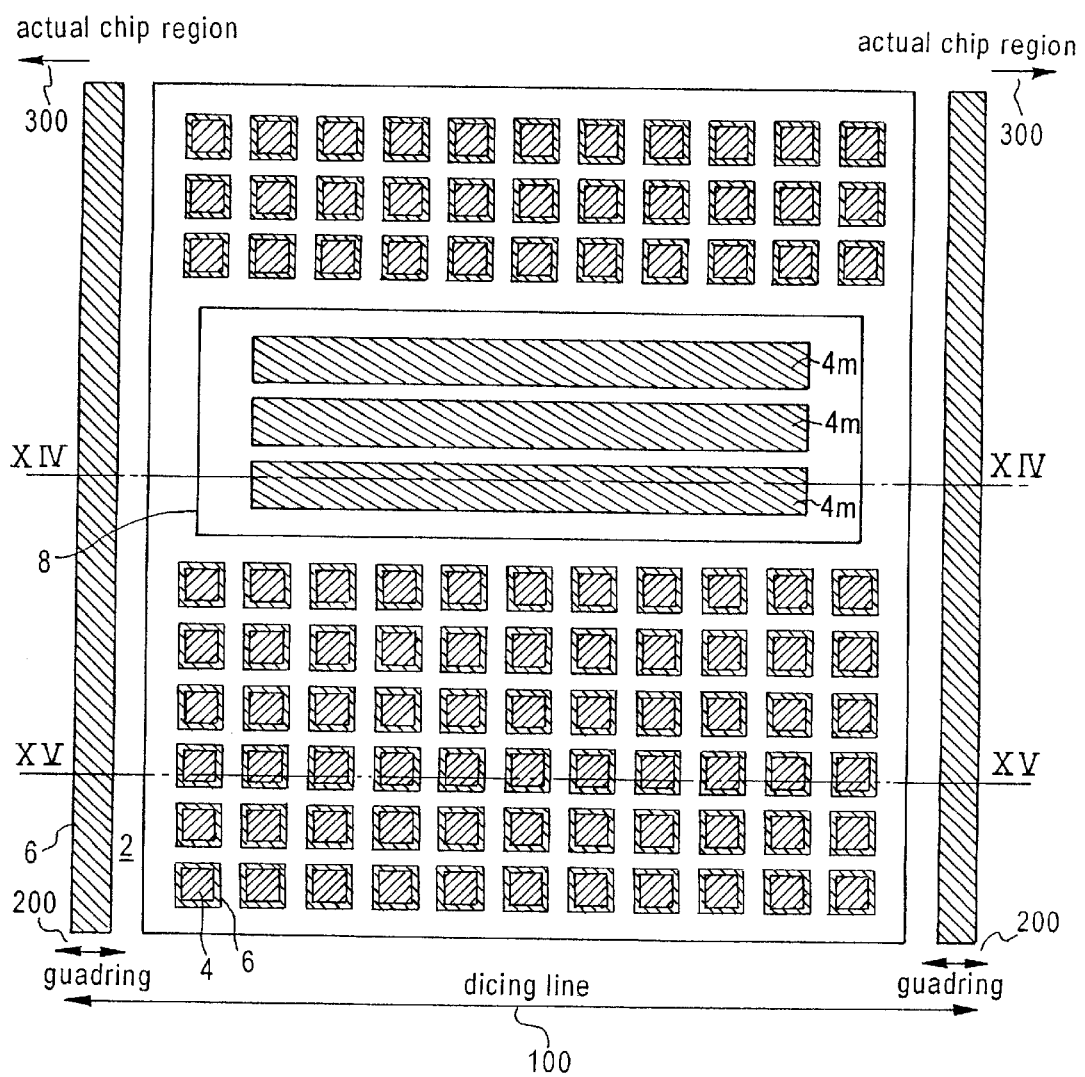
FIG. 13 is an enlarged schematic plan view showing a dicing line formed on the surface of a semiconductor substrate in a process of manufacturing a semiconductor device according to a fourth embodiment of the present invention.
Figure 14:
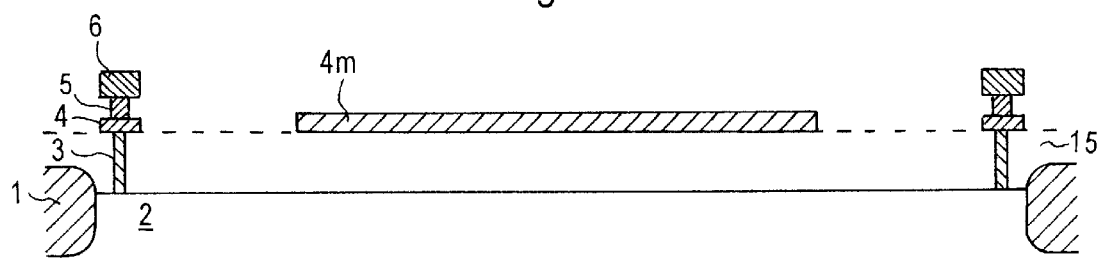
FIG. 14 is a schematic cross-sectional view taken along line XIV—XIV shown in FIG. 13.
Figure 15:
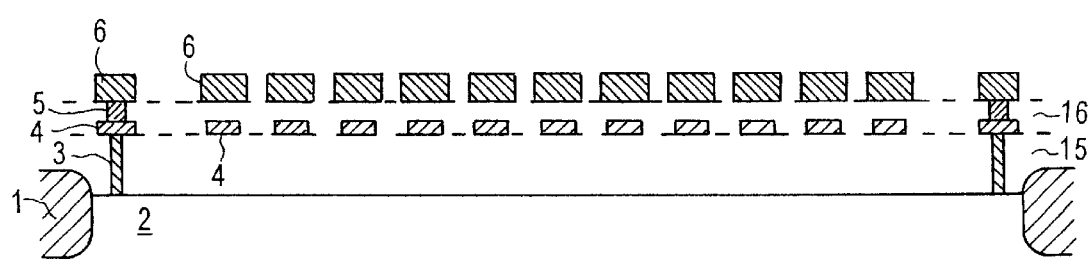
FIG. 15 is a schematic cross-sectional view taken along line XV—XV shown in FIG. 13.

FIGS. 13 through 15 are descriptive views for describing a dicing line used for a process of manufacturing a semiconductor device according to a fourth embodiment of the present invention. FIG. 13 is an enlarged schematic plan view showing a dicing line formed on the surface of a semiconductor substrate. FIG. 14 is a schematic cross-sectional view taken along line XIV—XIV shown in FIG. 13, and FIG. 15 is a schematic cross-sectional view taken along line XV—XV shown in FIG. 13.

In FIG. 13, a dicing line 100 runs vertically along the center of the drawing, and guardrings 200 are provided on opposite sides of the dicing line 100. A real chip region (an actual chip region) 300 exists outside the respective guardrings 200.

Further, in FIGS. 13 through 15, reference numerals 1 through 8 are assigned to the same elements as those described in connection with the first and second embodiments, and hence their explanations are omitted here. In the fourth embodiment, the third wiring pattern 4 and the fourth wiring pattern 6 differ in geometry from those described in connection with the first and second embodiments.

In the fourth embodiment, three horizontal strips of the fourth oxide film 4m formed in the longitudinal center of FIG. 13 are taken as marks. An area of predetermined width surrounding the marks is taken as the mark forbidden region 8. The area of the dicing line 100 outside the mark forbidden region 8 is filled with a dummy pattern. More specifically, the dummy pattern comprises a plurality of third substantially-square wiring patterns 4 which are provided on the second interlayer insulating film 15 and are spaced apart from one another; and a plurality of fourth substantially-square wiring patterns 6 which are geometrically similar to and larger than the fourth wiring patterns 6 and are spaced apart from one another, wherein the fourth wiring patterns 6 are vertically aligned with and superimposed on the respective third wiring patterns 4 so as to fully cover the same by way of the third interlayer insulating film 16.

As in the fourth embodiment, a plurality of island-shaped dummy patterns are formed so as to surround the mark forbidden region 8. As a result, exposure of the corners of the mark and formation of "dishing", which would otherwise be caused when an interlayer insulating film formed on the dummy patterns is smoothed by means of the CMP technique, can be prevented.

Since a resist film is likely to be formed to a uniform thickness on the interlayer insulating film, a mark pattern can be stably formed.

In addition, the fourth embodiment yields the following advantageous results. In the event the interlayer insulating film 15 of the third wiring pattern 4 cannot be smoothed sufficiently, exfoliation of a film, which would be caused when side walls are formed by etching the fourth wiring patterns 6, would be a problem of concern. Such a problem can be prevented by fully covering the wiring patterns 4 with the second wiring patterns 7, thus enabling stable formation of a mark pattern.

According to the fourth embodiment, the present invention prevents formation of etch residues during CMP abrasion, prevents abrasion of corners of the pattern during CMP abrasion (prevents formation of "dishing"), and prevents exfoliation of the side walls of the dummy pattern (realizes so-called countermeasures against exfoliation of a frame).

Fifth Embodiment

Figure 16:
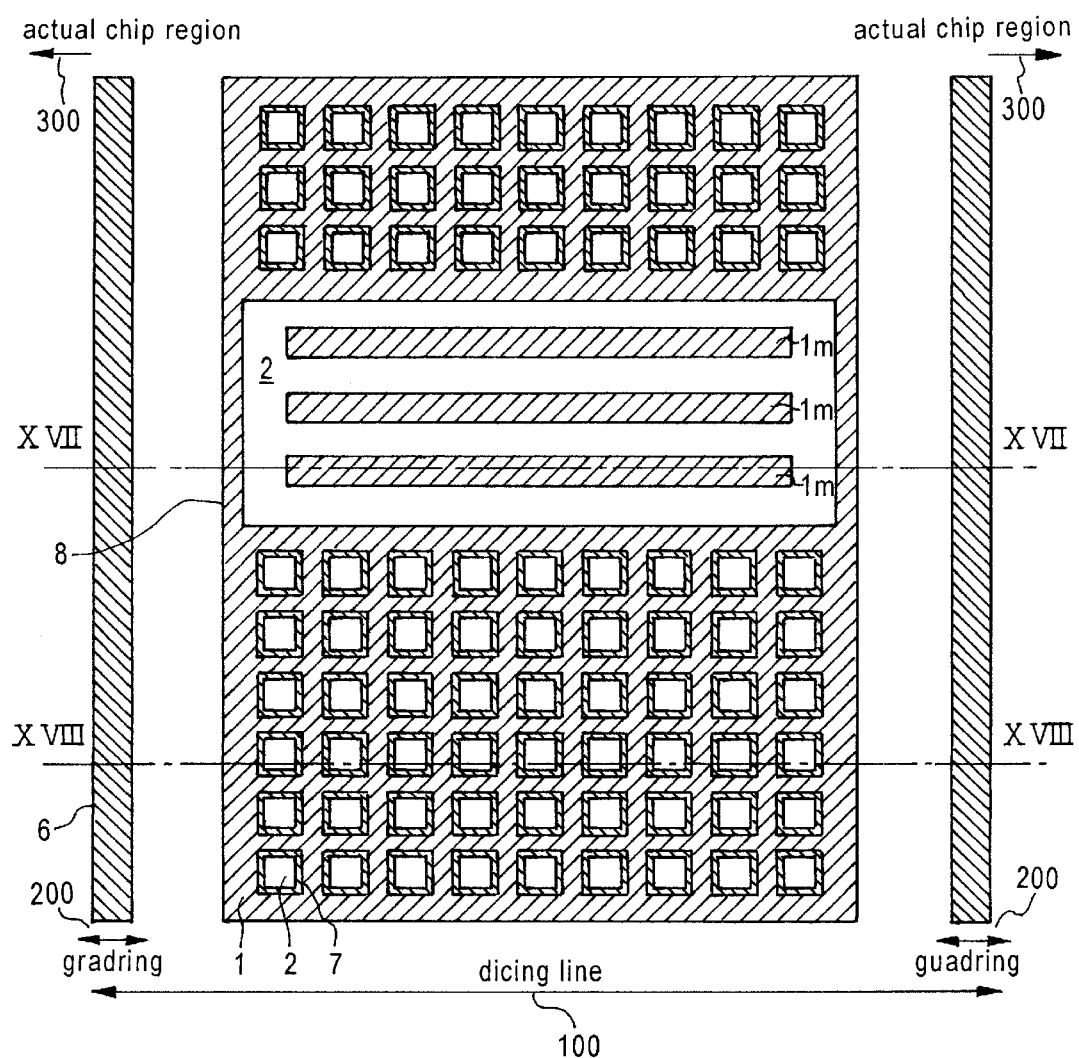
FIG. 16 is an enlarged schematic plan view showing a dicing line formed on the surface of a semiconductor substrate in a process of manufacturing a semiconductor device according to a fifth embodiment of the present invention.
Figure 17:
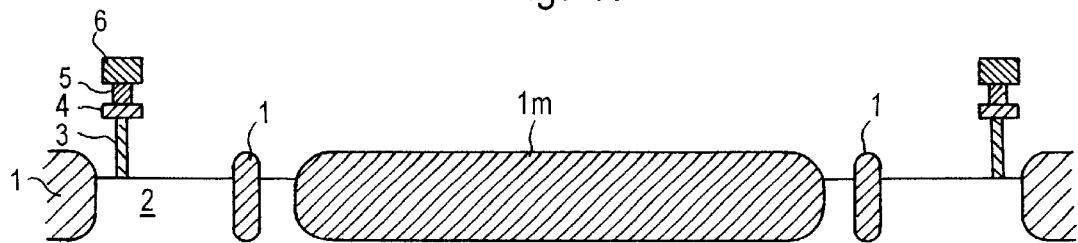
FIG. 17 is a schematic cross-sectional view taken along line XVII—XVII shown in FIG. 16.
Figure 18:
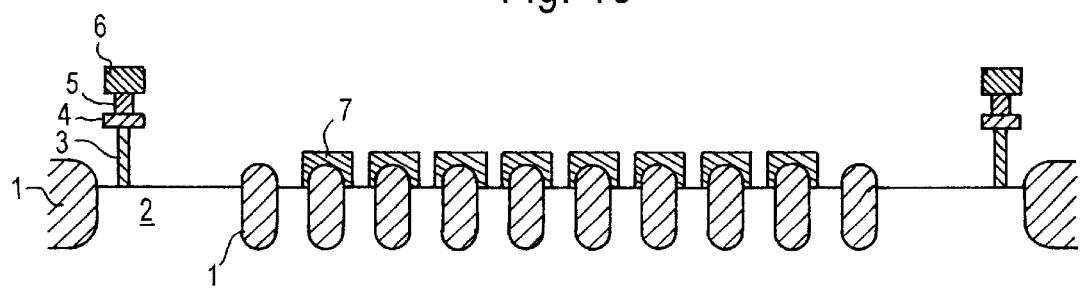
FIG. 18 is a schematic cross-sectional view taken along line XVIII—XVIII shown in FIG. 16.

FIGS. 16 through 18 are descriptive views for describing a dicing line used for a process of manufacturing a semiconductor device according to a fifth embodiment of the present invention. FIG. 16 is an enlarged schematic plan view showing a dicing line formed on the surface of a semiconductor substrate. FIG. 17 is a schematic cross-sectional view taken along line XVII—XVII shown in FIG. 16, and FIG. 18 is a schematic cross-sectional view taken along line XVIII—XVIII shown in FIG. 16.

In FIG. 16, a dicing line 100 runs vertically along the center of the drawing, and guardrings 200 are provided on opposite sides of the dicing line 100. A real chip region (an actual chip region) 300 exists outside the respective guardrings 200.

Further, in FIGS. 16 through 18, reference numerals 1 through 8 are assigned to the same elements as those described in connection with the first and second embodiments, and hence their explanations are omitted here. In the fifth embodiment, the trench isolation structures 1 and the first wiring pattern 7 differ in geometry from those described in connection with the first and second embodiments.

In the fifth embodiment, three horizontal strips of the fourth oxide film 1m formed in the longitudinal center of FIG. 16 are taken as marks. An area of predetermined width surrounding the marks is taken as the mark forbidden region 8. The area of the dicing line 100 outside the mark forbidden region 8 is filled with the trench isolation regions 1 such that a plurality of openings are formed in a matrix pattern in the trench isolation regions 1. The first wiring pattern 7 is formed so as to fully cover the trench isolation regions 1.

As in the fifth embodiment, the dummy patterns are formed so as to surround the mark forbidden region 8. As a result, exposure of the corners of the mark and formation of "dishing", which would otherwise be caused when an interlayer insulating film formed on the dummy patterns is smoothed by means of the CMP technique, can be prevented.

Since a resist film is likely to be formed to a uniform thickness on the interlayer insulating film, a mark pattern can be stably formed.

According to the fifth embodiment, the present invention prevents formation of etch residue during CMP abrasion, prevents abrasion of corners of the pattern during CMP abrasion (prevents formation of "dishing"), and prevents exfoliation of the side walls of the dummy pattern (realizes so-called countermeasures against exfoliation of a frame).

As has been described above, according to the present invention, a dummy pattern for CMP abrasion purpose is formed on a dicing line or a real chip region on a semiconductor substrate, so as to cope with a process (primarily a CMP abrasion process) corresponding to miniaturization of a semiconductor device.

The present invention prevents formation of etch residue during CMP abrasion and prevents abrasion of corners of the pattern during CMP abrasion (prevents formation of "dishing"), thus rendering the thickness of the resist film provided on the interlayer insulating film uniform; and enables reliable formation of the pattern. Further, the present invention mitigates stress exerted on the dummy pattern, prevents exfoliation of a film, and prevents exfoliation of the side walls of the dummy pattern (realizes so-called countermeasures against exfoliation of a frame).

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-152849, filed on May 31, 1999 including specification, claims, drawings and summary, on which the Convention priority of the present application is based, are incorporated herein by reference in its entirety.

What is claimed is:

1. A semiconductor device comprising:

a semiconductor substrate;

a plurality of real chip regions and at least a dicing line to separate the real chip regions respectively formed on the semiconductor substrate;

a mark section defined in the dicing line;

a mark forbidden region surrounding the mark section with a predetermined width in the dicing line; and a dummy wiring pattern formed so as to fill the dicing line to integrally and continuously surround the mark section and the mark forbidden region.

2. The semiconductor device according to claim 1, further comprising a pair of guardrings disposed on the opposite sides of the dicing line, wherein the dummy wiring pattern is formed so as to fill the dicing line bounded by the pair of guardrings.

3. The semiconductor device according to claim 1, wherein the dummy wiring pattern is a continuing single wiring pattern.

4. The semiconductor device according to claim 3, wherein the dummy wiring pattern is separated into a plurality of segments having a predetermined length along the dicing line.

5. The semiconductor device of claim 1, wherein said dummy pattern fills substantially the entire area of said dicing line surrounding the mark forbidden region.

6. The semiconductor device of claim 1, wherein said dummy pattern is completely spaced from said mark section.

7. A semiconductor device comprising:

a semiconductor substrate;

a plurality of real chip regions and at least a dicing line to separate the real chip regions respectively formed on the semiconductor substrate;

a mark section defined in the dicing line;

a mark forbidden region surrounding the mark section with a predetermined width in the dicing line;

a first dummy wiring pattern formed so as to fill the dicing line to integrally and continuously surround the mark section and the mark forbidden region;

an interlayer insulating layer formed on the first dummy wiring pattern; and a second dummy wiring pattern formed on the innerlayer insulating layer so as to fill the dicing line to integrally and continuously surround the mark section and the mark forbidden region.

8. The semiconductor device according to claim 7, further comprising a pair of guardrings disposed on the opposite sides of the dicing line, wherein the first and second dummy wiring patterns are formed so as to fill the dicing line bounded by the pair of guardrings.

9. The semiconductor device according to claim 7, wherein the first and second dummy wiring patterns are formed of a plurality of square portions arranged in a matrix pattern.

10. The semiconductor device according to claim 9, wherein each of the square portions of the second dummy wiring pattern is superimposed on each of the square portions of the first dummy wiring pattern.

11. The semiconductor device according to claim 10, wherein the area of each of the square portions of the second dummy wiring pattern is larger than the area of the square portions of the first dummy wiring pattern.

* * * * *